(12) United States Patent
Kang et al.

(10) Patent No.: US 6,700,812 B2
(45) Date of Patent: Mar. 2, 2004

(54) NONVOLATILE FERROELECTRIC MEMORY DEVICE AND METHOD FOR DRIVING THE SAME

(75) Inventors: Hee Bok Kang, Daejon-shi (KR); Hun Woo Kye, Ichon-shi (KR); Geun Il Lee, Yongin-shi (KR); Je Hoon Park, Songnam-shi (KR); Jung Hwan Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/251,848

(22) Filed: Sep. 23, 2002

(65) Prior Publication Data

US 2003/0094630 A1 May 22, 2003

(30) Foreign Application Priority Data

Nov. 19, 2001 (KR) .................................. P2001-71841

(51) Int. Cl.[7] .............................................. G11C 11/22
(52) U.S. Cl. ...................................... 365/145; 365/149
(58) Field of Search .............................. 365/145, 149, 365/210, 230.03

(56) References Cited

U.S. PATENT DOCUMENTS 5,999,438 A * 12/1999 Ohsawa ..................... 365/145
6,072,711 A   6/2000 Kang ........................... 365/65
6,091,622 A   7/2000 Kang ......................... 365/145
6,091,623 A   7/2000 Kang ......................... 365/145
6,118,687 A   9/2000 Kang ......................... 365/145
6,118,695 A   9/2000 Yoneyama ............. 365/185.09
6,128,213 A  10/2000 Kang ......................... 365/145

FOREIGN PATENT DOCUMENTS

| JP | 11306766 | 10/1999 | ........... G11C/11/22 |
| JP | 113353882 | 12/1999 | ........... G11C/11/22 |

* cited by examiner

Primary Examiner—Son Mai
Assistant Examiner—G. Stanley
(74) Attorney, Agent, or Firm—Morgan, Lewis & Bockius LLP

(57) ABSTRACT

A nonvolatile ferroelectric memory device includes a first cell array block and a second cell array block, each divided into an upper part and a lower part; sensing amplifiers arranged one by one on multiple bit lines at a middle portion between the first cell array block and the second cell array block; a data I/O encoder connected to end portions of the multiple bit lines for outputting multi-bit signals by encoding outputs of the sensing amplifiers; and a first reference cell array block and a second reference cell array block arranged between the first cell array block and the data I/O encoder and between the second cell array block and the data I/O encoder.

13 Claims, 10 Drawing Sheets

NONVOLATILE FERROELECTRIC MEMORY DEVICE AND METHOD FOR DRIVING THE SAME

This application claims the benefit of the Korean Application No. P2001-71841 filed on Nov. 19, 2001, which is hereby incorporated by reference.

BACKGROUND OF THE INVENTION

1. Field of the Invention

The present invention relates to a nonvolatile ferroelectric memory device, and more particularly, to a nonvolatile ferroelectric memory device, in which four or more data levels are stored in one memory cell to obtain a multi-bit, and a method for driving the nonvolatile ferroelectric memory device.

2. Discussion of the Related Art

Generally, a nonvolatile ferroelectric memory, i.e., a ferroelectric random access memory (FRAM) has a data processing speed equal to that of a dynamic random access memory (DRAM) and retains data even when power is off. For this reason, the nonvolatile ferroelectric memory has attracted considerable attention as a next generation memory device.

The FRAM and DRAM have similar structures as memory devices, but the FRAM includes a ferroelectric capacitor characterized by its high residual polarization.

Such a ferroelectric capacitor with the high residual polarization allows data to be maintained even if an electric field is removed.

FIG. 1 shows a hysteresis loop of a conventional ferroelectric.

As shown in FIG. 1, even if polarization induced by an electric field has the electric field removed, data is maintained at a certain amount (i.e., "d" and "a" states) without being erased due to the presence of residual polarization (or spontaneous polarization).

A nonvolatile ferroelectric memory cell is used as a memory device such that the "d" and "a" states correspond to 1 and 0, respectively.

FIG. 2 illustrates a schematic view of a unit cell according to a conventional nonvolatile ferroelectric memory.

As shown in FIG. 2, a bit line B/L is formed in one direction, and a wordline W/L is formed in a direction crossing the bit line B/L. A plate line P/L is spaced apart from the wordline W/L in a parallel direction with the wordline W/L. A transistor T1 has a gate connected with the wordline W/L and a source connected with the bit line B/L. A ferroelectric capacitor FC1 has its first terminal connected with a drain of the transistor T1 and its second terminal connected with the plate line P/L.

The data input/output operation of the conventional nonvolatile ferroelectric memory device will be explained.

FIG. 3A is a timing chart illustrating a write mode operation of the conventional ferroelectric memory, and FIG. 3B is a timing chart illustrating a read mode operation thereof.

In the write mode operation, as shown in FIG. 3A, an externally applied chip enable signal CSBpad is activated from a high level to a low level, and at the same time a write enable signal WEBpad is applied from a high level to a low level, thereby starting the write mode operation.

Subsequently, if address decoding starts in the write mode operation, a pulse applied to a corresponding wordline W/L is transited from a low level to a high level to select cells. A high signal in a certain period and a low signal in a certain period are sequentially applied to a corresponding plate line P/L in a period where the wordline W/L is maintained at the high level.

To write a logic value "1" or "0" in the selected cell, a high signal or a low signal synchoronized with the write enable signal WEBpad is applied to a corresponding bitline B/L.

In other words, a high signal is applied to the bitline B/L, and if the low signal is applied to the plate line P/L in a period during which the signal applied to the wordline W/L is high, a logic value "1" is written in the ferroelectric capacitor FC1.

A low signal is applied to the bitline B/L, and if the signal applied to the plate line P/L is high, a logic value "0" is written in the ferroelectric capacitor FC1.

An explanation will be given below as to the read mode operation, data of which is stored in a cell by the above-described write mode operation.

As shown in FIG. 3B, if an externally applied chip enable signal CSBpad is activated from a high level to a low level, all the bitlines become equipotential to a low voltage by an equalizer signal EQ before a corresponding wordline W/L is selected.

Then, the respective bitline B/L becomes inactive and an address is decoded. The low signal is transited to the high signal in the corresponding wordline W/L by the decoded address, so that a corresponding cell is selected.

The high signal is applied to the plate line P/L of the selected cell to destroy data corresponding to the logic value "1" stored in the ferroelectric capacitor FC1.

At this time, if the logic value "0" is stored in the ferroelectric capacitor FC1, the corresponding data is not destroyed.

The destroyed data and the non-destroyed data are output as different values by the ferroelectric hysteresis loop, so that a sensing amplifier senses the logic value "1" or "0".

That is, if the data is destroyed, the "d" state is transited to a "f" state as shown in the hysteresis loop of FIG. 1. If the data is not destroyed, the "a" state is transited to the "f" state.

Thus, if the sensing amplifier is enabled after a set time elapses, the logic value "1" is output in the case where the data is destroyed, whereas the logic value "0" is output in the case where the data is not destroyed.

As described above, after the sensing amplifier outputs data, to recover the data to its original data, the plate line P/L becomes inactive from the high level to the low level in a state in which the high signal is applied to the corresponding wordline.

However, the conventional nonvolatile ferroelectric memory cell has the following problems.

There is a limitation in reducing a chip size by storing data levels in all the cells. Also, there is a difficulty in obtaining the cost competitiveness of the chip.

SUMMARY OF THE INVENTION

Accordingly, the present invention is directed to a nonvolatile ferroelectric memory device and a method for driving the same that substantially obviates one or more problems due to limitations and disadvantages of the related art.

An object of the present invention is to provide a nonvolatile ferroelectric memory device and a method for driving the same in which a chip size is reduced and a chip has an enhanced cost competitiveness by replacing the conventional plurality of memory cells with one memory cell.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a nonvolatile ferroelectric memory device according to the present invention includes a first cell array block and a second cell array block, each divided into an upper part and a lower part; sensing amplifiers arranged one by one on multiple bit lines at a middle portion between the first cell array block and the second cell array block; a data I/O encoder connected to end portions of the multiple bit lines for outputting multi-bit signals by encoding outputs of the sensing amplifiers; and a first reference cell array block and a second reference cell array block arranged between the first cell array block and the data I/O encoder and between the second cell array block and the data I/O encoder.

In another aspect of the present invention, a method for driving a nonvolatile ferroelectric memory device having a bit line including one sub bit line and first, second, and third multiple bit lines, the method comprising the steps of selectively connecting the sub bit line to the first, second and third multiple bit lines by respectively connecting first, second, and third switching control blocks to the first, second and third multiple bit lines; activating the first, second and third switching control blocks by external controlling signals; connecting the sub bit line to a drain of a pull-down switching block; applying an external sub bit line pull-down signal to a gate of the pull-down switching block; applying is applied a signal for adjusting a power to the sub bit line to a source of the pull-down switching blocks; and storing cell data by applying a write voltage to the sub bit line from a low level to a high level.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
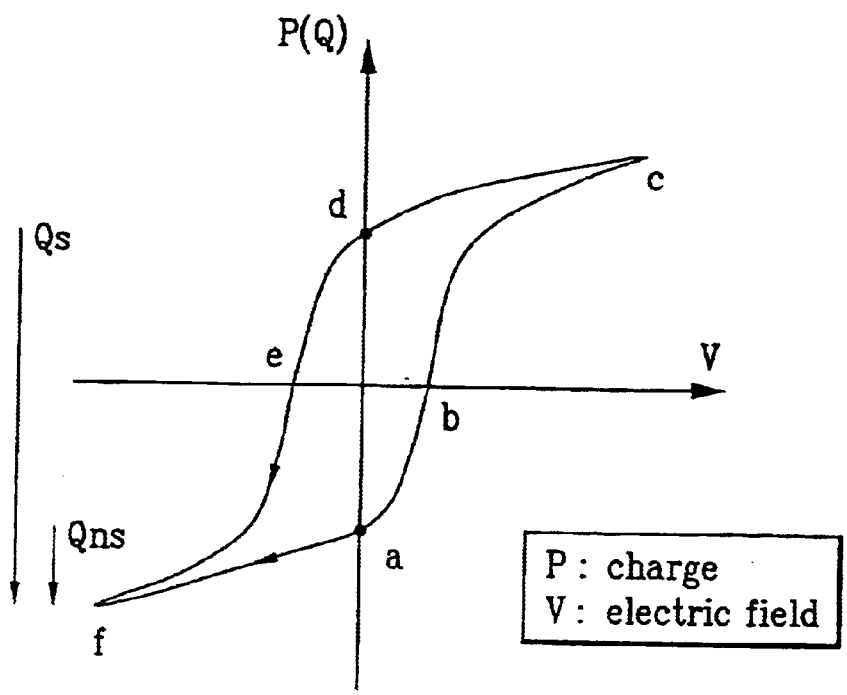
FIG. 1 illustrates hysteresis loop of a conventional ferroelectric.
Figure 2:
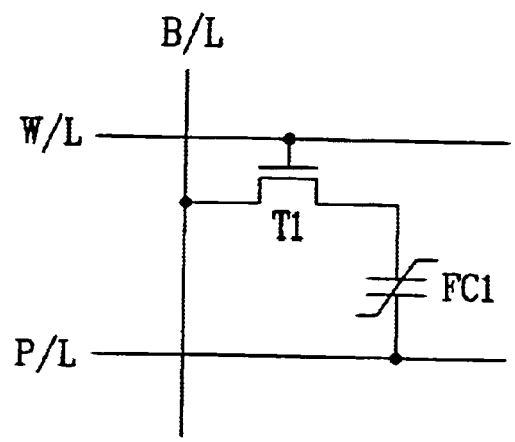
FIG. 2 illustrates a schematic view of a unit cell of a conventional nonvolatile ferroelectric memory.
Figure 3A:
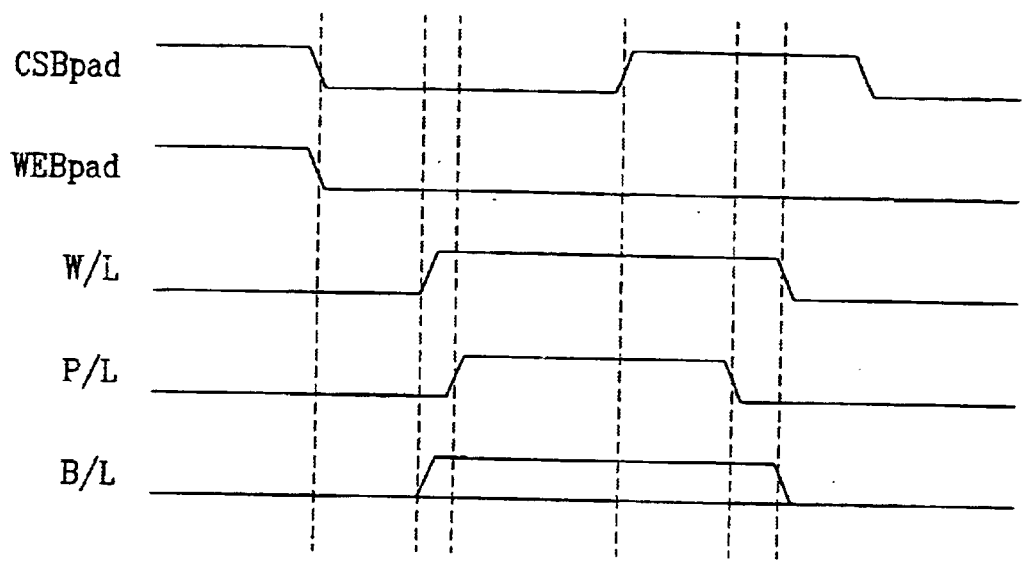
FIG. 3A illustrates a timing chart showing the operation of a write mode of the conventional ferroelectric memory.
Figure 3B:
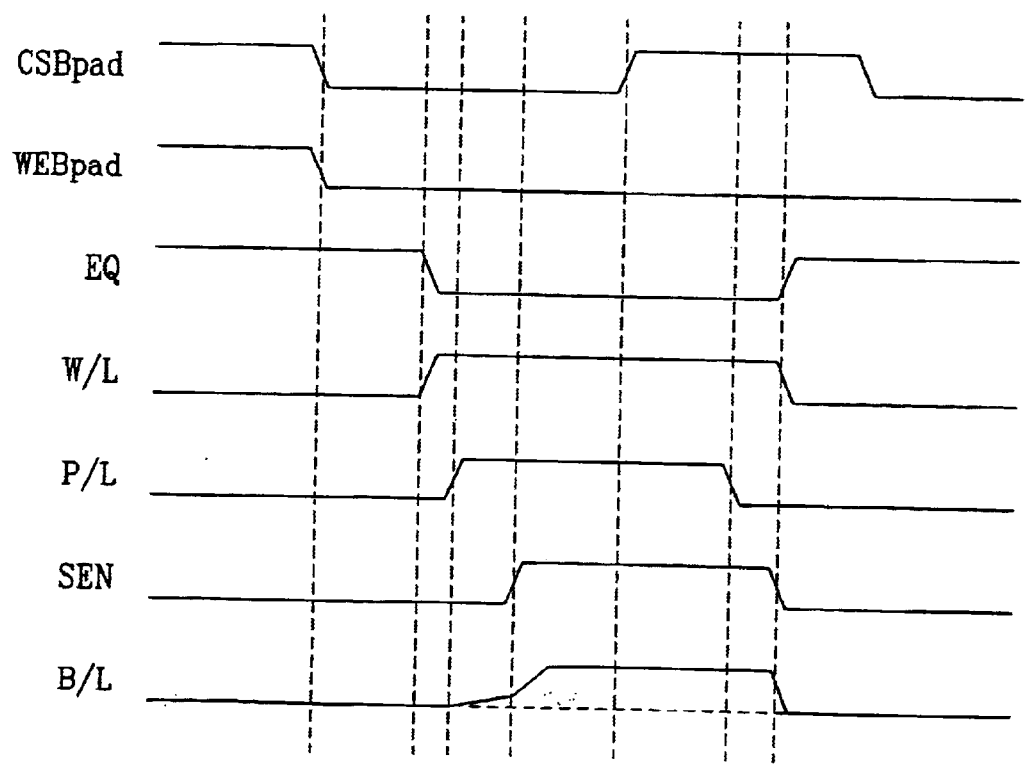
FIG. 3B illustrates a timing chart showing the operation of a read mode of the conventional ferroelectric memory.
Figure 4:
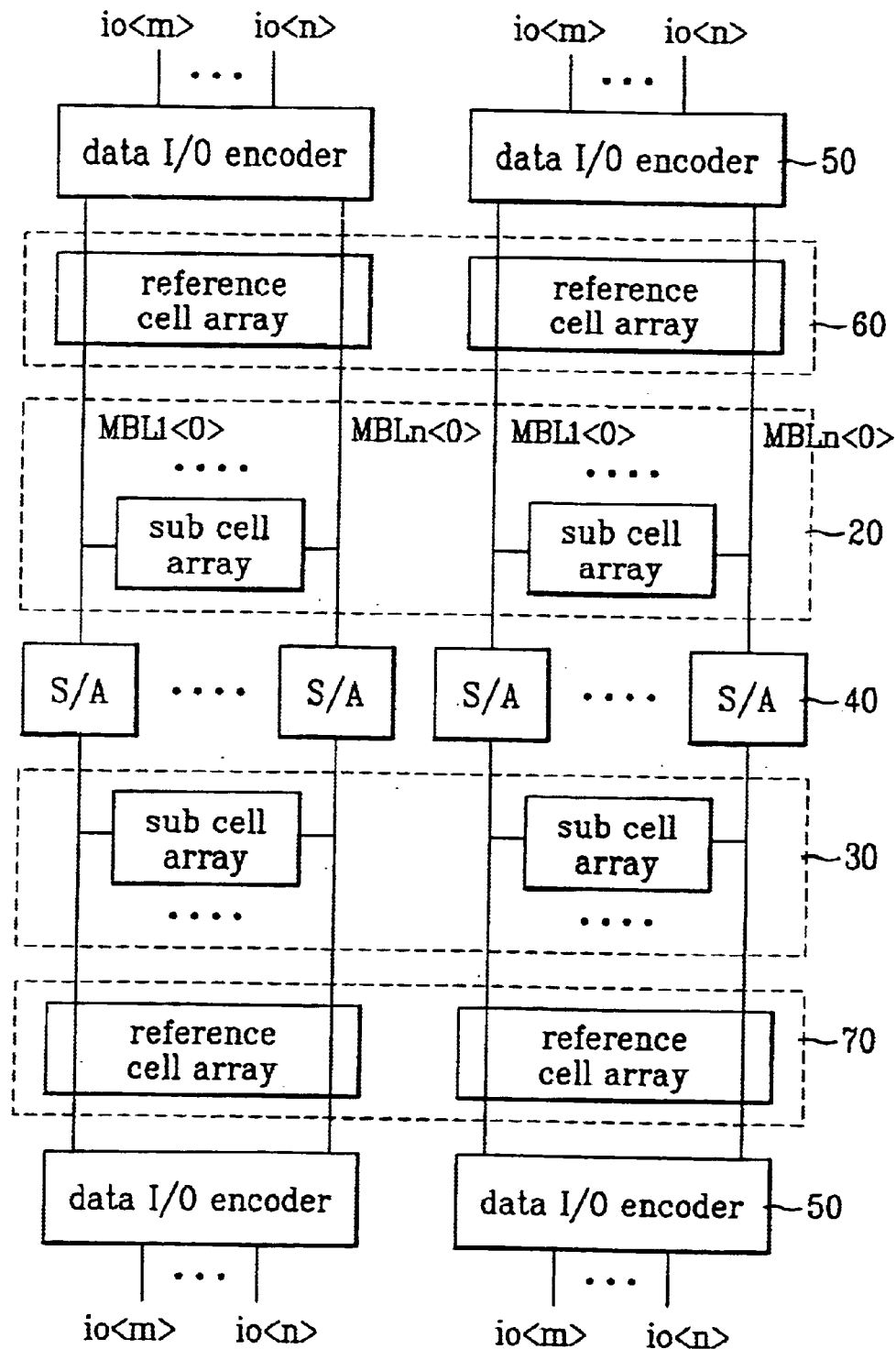
FIG. 4 illustrates a schematic view showing a nonvolatile ferroelectric memory device according to the present invention.

FIG. 4 illustrates a schematic view of a nonvolatile ferroelectric memory device having a multi-bit function in accordance with the present invention.

As shown in FIG. 4, the nonvolatile ferroelectric memory device includes first and second cell array blocks 20 and 30 arranged one on a top portion and the other on a bottom portion; a plurality of sensing amplifiers S/A 40 arranged one by one per each multiple bit line MBLn between the first and second cell array blocks 20 and 30; a plurality of data I/O encoders 50 for outputting multi bit signals by encoding outputs of the sensing amplifier 40, the data I/O encoder 50 connected to data buses io<m>, . . . , io<n> at both ends of the multiple bit lines MBLn; and first and second reference cell array blocks 60 and 70 arranged between the first and second cell array blocks 20 and 30 and the plurality of data I/O encoders 50.

Meanwhile, the first and second cell array blocks 20 and 30 are respectively formed of a plurality of sub cell arrays.

Figure 5:
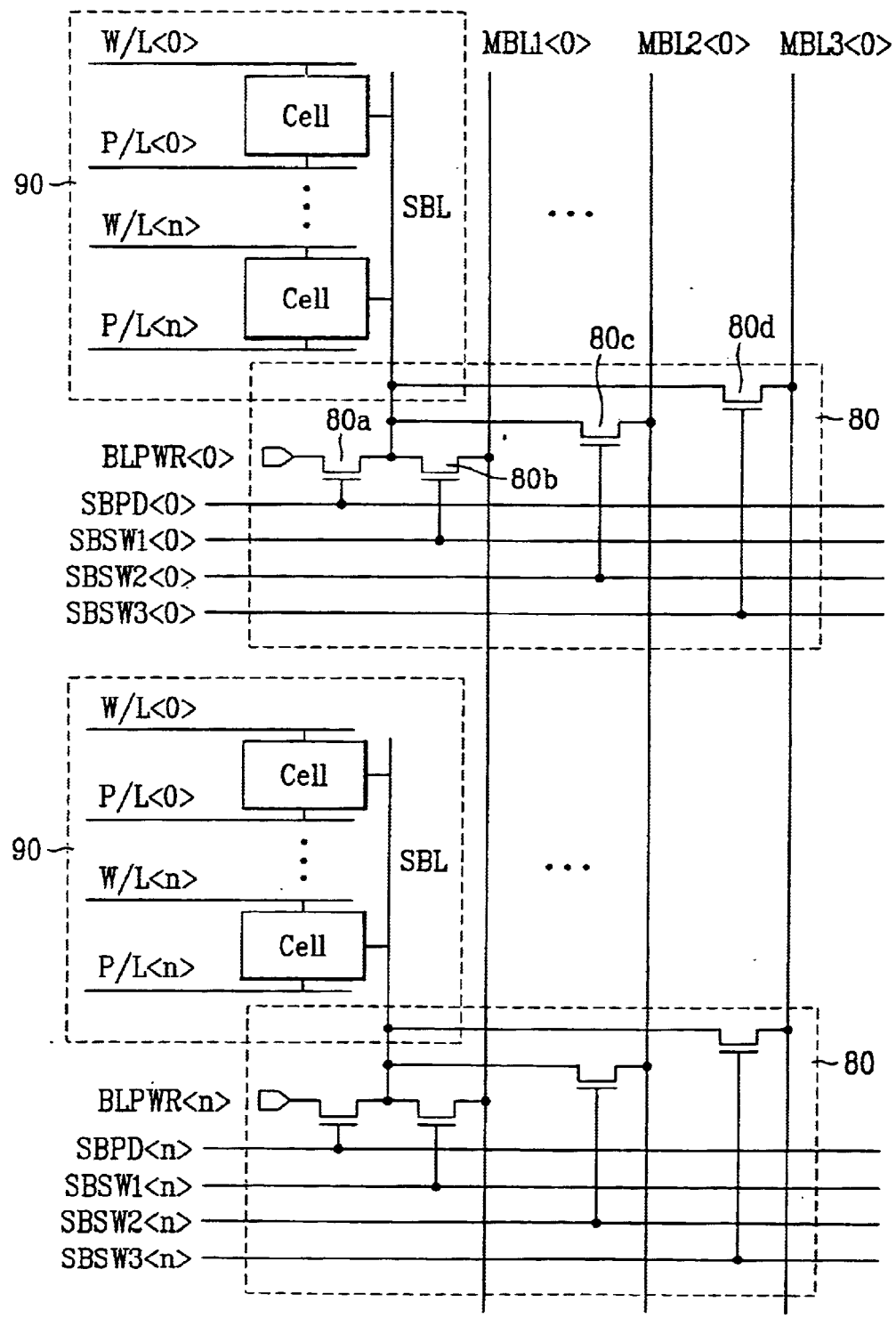
FIG. 5 illustrates a detailed circuit diagram showing a 2-bit cell array in a cell array block in FIG. 4.

FIG. 5 illustrates a detailed circuit diagram showing a 2-bit cell array in a cell array block of FIG. 4.

As shown in FIG. 5, a bit line is formed of one sub bit line SBL and three multiple bit lines MBL1, MBL2, and MBL3.

Each of the three multiple bit lines MBL1, MBL2, and MBL3 is connected to the sub bit line SBL through a switching control block 80.

The switching control block 80 includes first, second, third, and fourth switching transistors 80a, 80b, 80c, and 80d connected to one another in series.

Respective signals including an external sub bit line pull-down signal SBPD<0> and external controlling signals SBSW1<0>, SBSW2<0> and SBSW3<0> are independently applied to gates of the first, second, third, and fourth switching transistors 80a, 80b, 80c, and 80d, so that the first, second, third, and fourth transistors are activated by these signals.

Meanwhile, the first switching transistor 80a is a pull-down NMOS switching device including a drain (or a source) connected to the sub bit line SBL; a source (or a drain) to which an external signal BLPWR<0> is applied, the external signal BLPWR<0> serving to adjusting a power to the SBL; and a gate to which the sub bit line pull-down signal SBPD<0> is applied.

Herein, the first switching transistor 80a adjusts the sub bit line SBL to the ground level or to a high level in a case where the sub bit pull-down signal SBPD signal for adjusting a signal of the sub bit line SBL is activated.

Meanwhile, the signal BLPWR applied to the first switching transistor 80a generates a voltage higher than Vcc and supplies the voltage to the sub bit line SBL at the time when a high voltage is occurred in a low voltage.

Also, the second, third, and fourth switching transistors 80b, 80c, and 80d are formed of NMOS transistors including each source (or each drain) connected to the sub bit line SBL; each drain (or each source) connected to the main bit lines MBL1, MBL2, and MBL3; and each gate to which the external controlling signals SBSW1<0>, SBSW2<0>, SBSW3<0> are applied.

That is, the second switching transistor 80b includes a source connected to the sub bit line SBL; a drain connected to the main bit line MBL; and a gate to which the external controlling signal SBSW1<0> is applied. The third switching transistor 80c includes a source connected to the sub bit line SBL; a drain connected to the main bit line MBL2; and a gate to which the external controlling signal SBSW2<0> is applied. And, the fourth switching transistor 80d includes a source connected to the sub bit line; a drain connected to the main bit line MBL3; and a gate to which the external controlling signal SBSW3<0> is applied.

Also, a plurality of cells are connected to the sub bit line SBL, thereby constituting a sub cell array block 90.

That is, the sub cell array block 90 includes the sub bit line SBL arranged in one direction; a word line W/L<n> arranged in a perpendicular direction to the sub bit line SBL; and a plurality of cells in a plate line P/L<n>.

Herein, although not shown in drawings, the cell includes one transistor and one ferroelectric capacitor.

Figure 6:
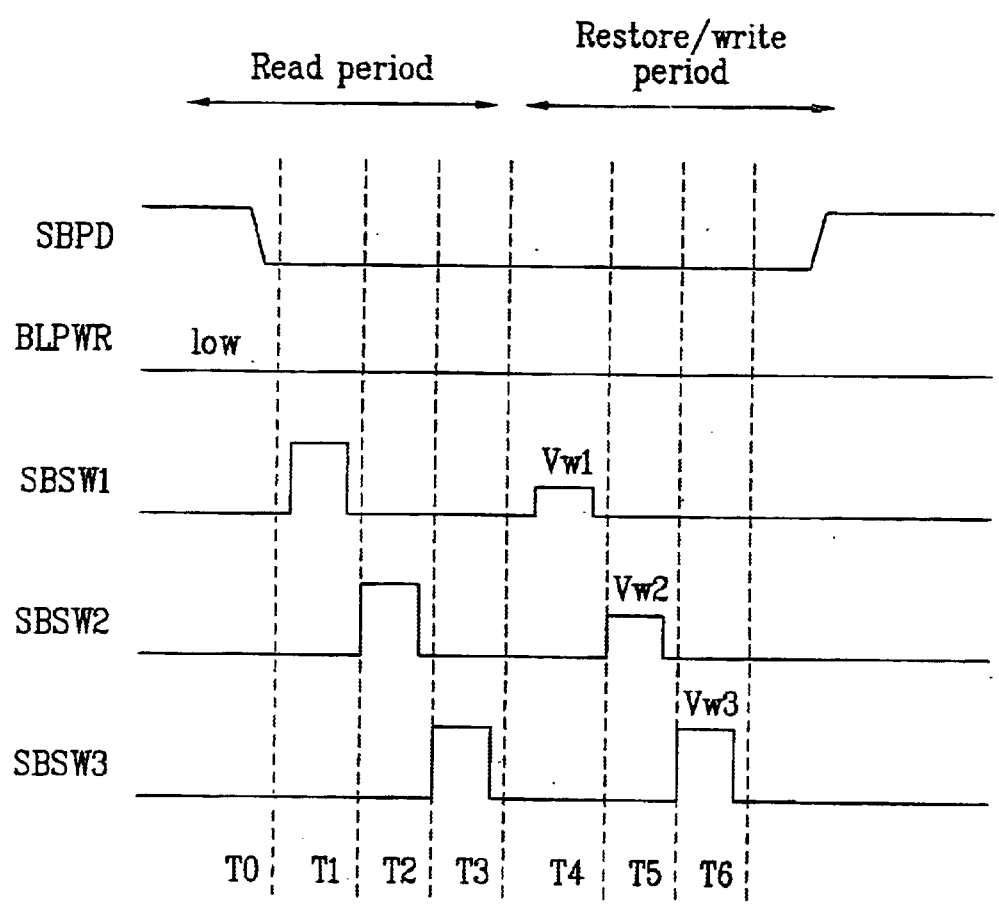
FIG. 6 illustrates a timing chart showing a method for operating the read and write modes of the 2-bit cell array in FIG. 5.

FIG. 6 illustrates a timing chart showing a method for operating read and write modes of a 2-bit cell array of FIG. 5.

First, in a T0 period, the sub bit line SBL is reset low by a low signal of the signal BLPWR with a high signal of the sub bit line pull-down signal SBPD.

Subsequently, during T1~T6 periods, the sub bit line SBL becomes a float state with the sub bit line pull-down signal SBPD being a low level.

Then, during T1~T4 periods, if the external controlling signal SBSW1 is activated, the sub bit line SBL is connected to the main bit line MBL1, thereby transmitting cell data to the main bit line MBL1 only for T1~T4 times.

Also, during T2~T5 periods, if the external controlling signal SBSW2 is activated, the sub bit line SBL is connected to the main bit line MBL2, thereby transmitting cell data to the main bit line MBL2 for T2~T5 times.

Likewise, during T3~T6 periods, if the external controlling signal SBSW3 is activated, the sub bit line SBL is connected to the main bit line MBL3, thereby transmitting cell data to the MBL3 for T3~T6 times.

Herein, T0~T3 are periods for reading, and T4~T6 are periods for restoring in a read mode and for writing in a write mode.

Meanwhile, as restore and write modes of data, a charge amount stored in a cell is adjusted by differently adjusting write voltages applied to the sub bit line SBL.

That is, in a 2-bit restore cell, voltages of the sub bit line SBL are largely divided into 4 regions to restore data.

That is, cell data are restored with 4-level voltages of $0<Vw1<Vw2<Vw3$.

Figure 7:
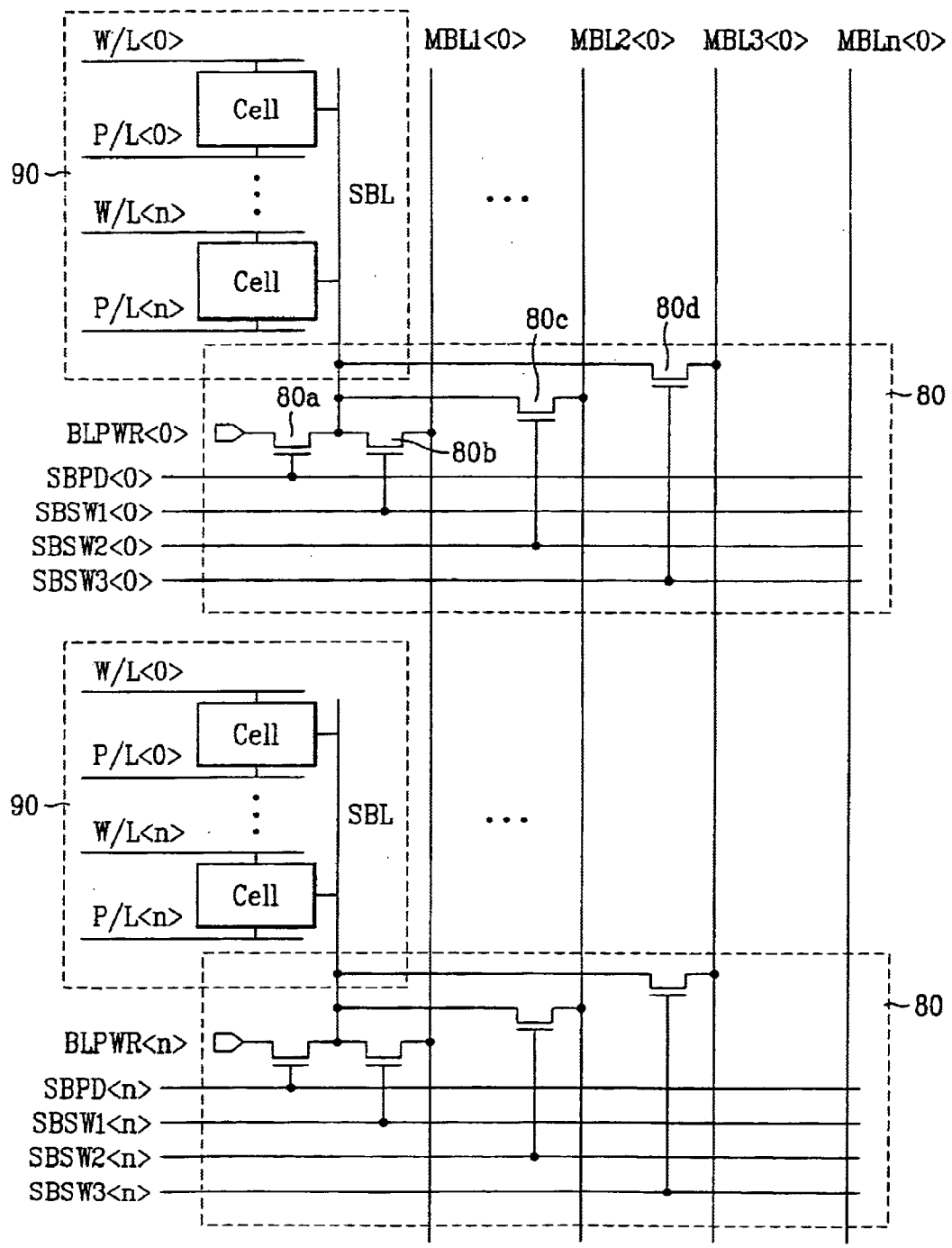
FIG. 7 illustrates a detailed circuit diagram showing a N-bit cell array in a cell array block of FIG. 4.

FIG. 7 illustrates a detailed circuit diagram showing an N-bit cell array in the cell array block of FIG. 4.

As shown in FIG. 7, bit lines includes one sub bit line SBL and N multiple bit lines MBL1, MBL2, . . . , MBLn.

The multiple bit lines are respectively connected to the sub bit line SBL through the switching control block 80.

Herein, in the switching control block 80, a plurality of NMOS transistors are connected to one another in series. At this time, gates of the respective transistors are activated by signals SBSW1<0>, SBSW2<0>, SBSW3<0>. . . SBSWn<0> corresponding to independent controlling signals.

That is, each transistor includes a source (or a drain) connected to the sub bit line SBL; a drain (or a source) respectively connected to the multiple bit lines MBL1, MBL2 . . . , MBLn; a gate to which the controlling signals SBSW1<0>, SBSW2<0>, SBSW3<0>, . . . are respectively applied.

Meanwhile, the first NMOS transistor of the switching control block 80 includes a drain connected to the sub bit line SBS; a source to which an external signal BLPWR<0> is applied, the BLPWR<0> for adjusting a power to the sub bit line SBL; and a gate to which a sub bit line pull-down signal is applied, thereby being used as a pull-down NMOS transistor to adjust a level of the sub bit line SBL.

Herein, if the sub bit line pull-down signal SBPD corresponding to an adjustment signal of the sub bit line SBL is activated in the pull-down NMOS transistor, the sub bit line is adjusted into the ground level or a high level.

Meanwhile, the signal BLPWR<0> generates a voltage higher than Vcc and supplies the voltage to the sub bit line SBL in a case where a high voltage is occurred in a low voltage.

Also, a plurality of cells are connected to the sub bit line SBL to constitute the sub cell array block 90.

That is, the sub cell array block 90 includes a sub bit line SBL arranged in one direction; a wordline W/L<n> arranged in a perpendicular direction to the sub bit line SBL; and a plurality of cells in a plate line P/L<n>.

Herein, although not shown, the cell includes one transistor and one ferroelectric capacitor.

Figure 8:
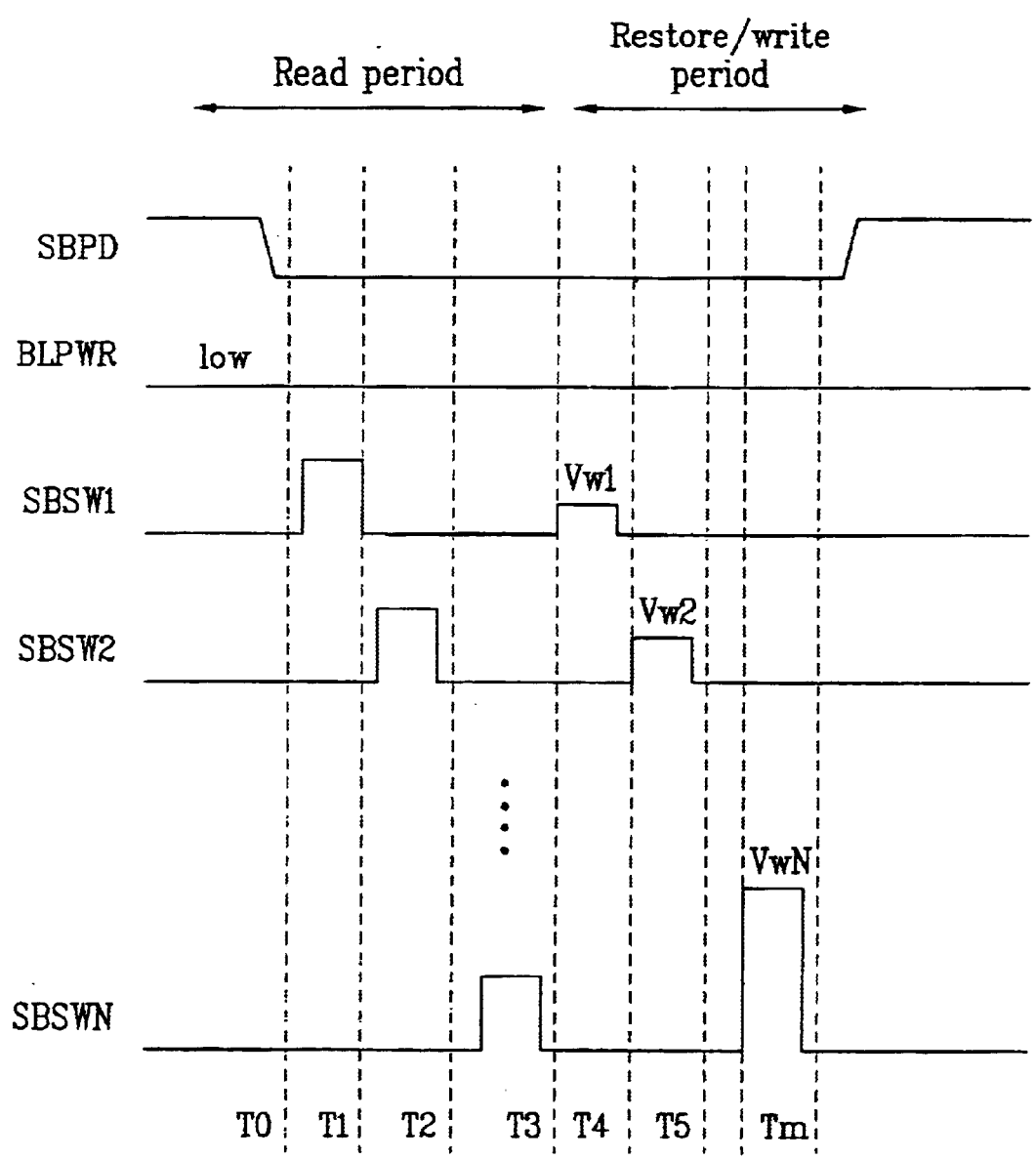
FIG. 8 illustrates a timing chart showing a method for operating the read and write modes of the N-bit cell array of FIG. 7.

FIG. 8 illustrates a timing chart showing a method for operating read and write modes of the N-bit cell array of FIG. 7;

First of all, during a T0 period, the sub bit line SBL is reset low such that the BLPWR signal is low and the sub bit line pull-down signal SBPD is high.

Subsequently, during T1Tm periods, the sub bit line SBL becomes a float state in which the sub bit line pull-down signal SBPD is low.

Then, during T1~T4 periods, if the controlling signal SBSW1 is activated, the sub bit line SBL is connected to the main bit line MBL1, thereby transmitting cell data to the main bit line MBL1 only for T1~T4 times.

Also, during T2~T5 periods, if the controlling signal SBSW2 is activated, the sub bit line SBL is connected to the main bit line MBL2, thereby transmitting cell data to the main bit line MBL2 only for T2~T5 times.

Similarly, during T3~Tm periods, if the controlling signal SBSWn is activated, the sub bit line SBL is connected to the main bit line MBLn, thereby transmitting cell data to the main bit line MBLn only for T3~Tm times.

Meanwhile, T0~T3 are periods for reading, and the T4~Tm are periods for restoring in a read mode and for writing in a write mode.

Herein, as the restore and write modes, a charge amount stored in a cell is adjusted by differently controlling a write voltage applied to the sub bit line SBL.

That is, in a 2-bit restore cell, a voltage level of the sub bit line SBL is largely divided into N regions to restore data.

That is, cell data are restored by N voltages of 0<Vw1<Vw2<...<VwN.

Figure 9:
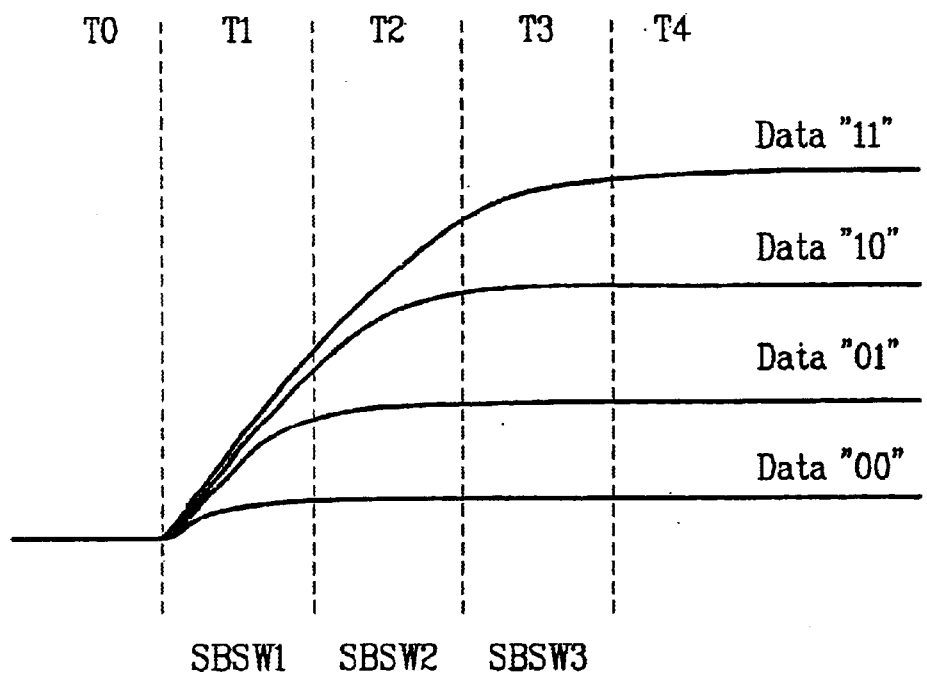
FIG. 9 illustrates a BL voltage depending on time for operating a cell in a read mode of a 2-bit cell array.

FIG. 9 illustrates a BL voltage depending on time for operating a cell in a read mode of a 2-bit cell array.

That is, FIG. 9 illustrates a method for detecting each level by dividing voltages of the main bit line MBL depending on time into each time period by means of the controlling signal SBSW, and then by distributing generated charges in the corresponding periods to each main bit line MBL.

First of all, if the controlling signal SBSW1 is activated during T1 period and then cell data are transmitted to the main bit line MBL1 connected to the sub bit line SBL for T1 time, two levels of cell data, that is, data "01" or data "00" are recognized.

Then, if the controlling signal SBSW2 is activated during T2 period and then cell data are transmitted to the main bit line MBL2 connected to the sub bit line SBL for T2 time, two levels of cell data, that is, data "10" or data "01" are recognized.

Then, if the controlling signal SBSW3 is activated during T3 period and then cell data are transmitted to the main bit line MBL3 connected to the sub bit line SBL during T3 time, two levels of cell data, that is, data "11" or data "10" are recognized.

Accordingly, if three main bit lines MBLs are all high, 2-bit data output "11." If two main bit lines MBLs, are high, that is, the main bit line MBL1 and the main bit line MBL2 are high, 2 bit data output "10." If one main bit line MBL is high, 2-bit data output "01." And, if three main bit lines MBLs are all low, 2-bit data output "00."

Figure 10:
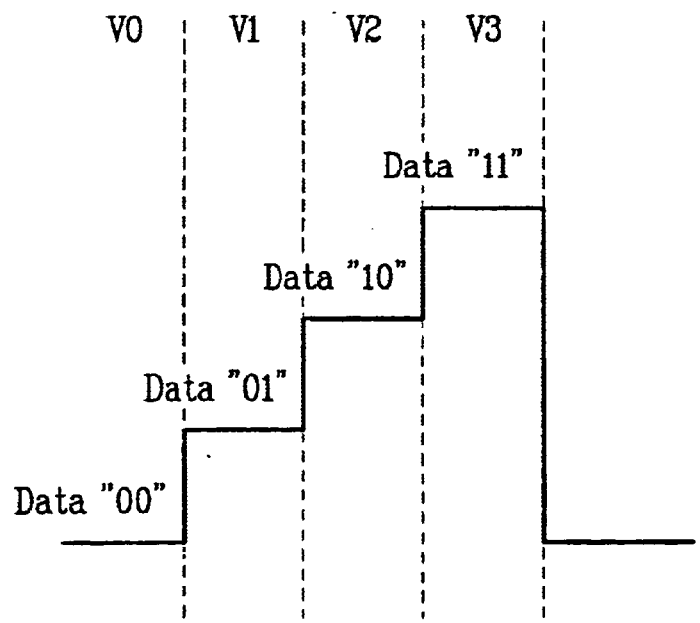
FIG. 10 illustrates a level of an electric charge for storing a cell depending on a SBSW voltage in a write mode of a 2-bit cell array according to the present invention.

FIG. 10 illustrates a charge level for storing a cell depending on a SBSW voltage in a write mode of a 2-bit cell array according to the present invention.

As shown in FIG. 10, to write 2-bit data "00," a cell is written at a voltage of V0. Also, to write 2-bit data "01," a cell is written at a voltage of V1.

Likewise, to write "10," a cell is written at a voltage of V2, and to write "11," a cell is written at a voltage of V3.

Figure 11A:
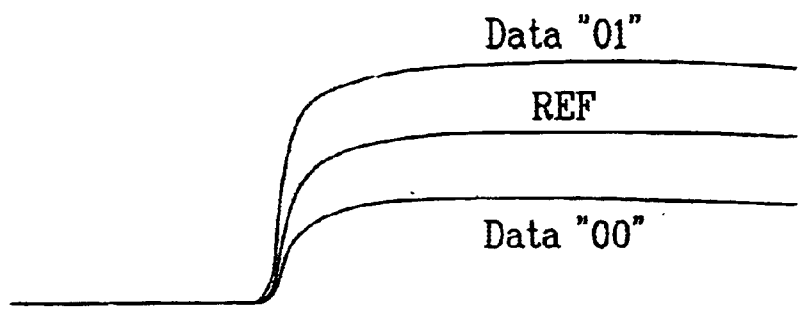
FIGS. 11A to 11C illustrate a MBL voltage depending on time for operating a cell in a read mode of a 2-bit cell according to the present invention.
Figure 11B:
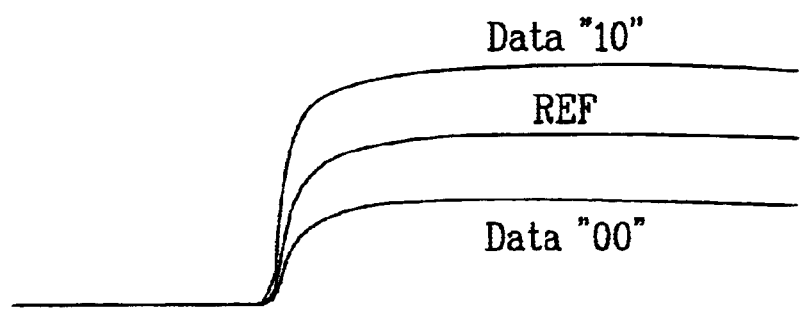
Figure 11C:
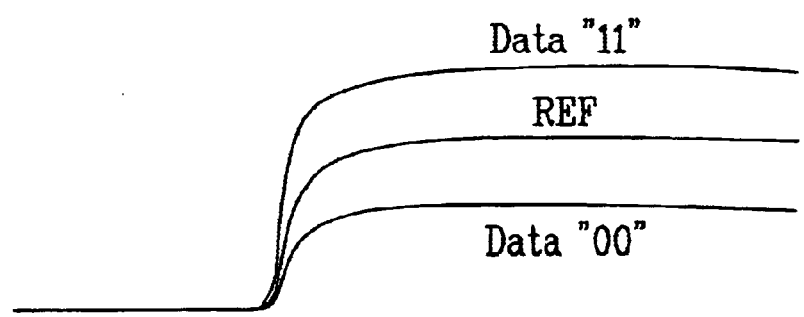

FIGS. 11A to 11C illustrate a MBL (main bit line) voltage depending on time for operating a cell in a 2-bit cell read mode according to the present invention.

That is, FIGS. 11A to 11C illustrate each MBL level at the time when a MBL voltage depending on time is divided into each time period by means of the controlling signal SBSW, and then charges generated in the corresponding periods are distributed to each main bit line.

First of all, as shown in FIG. 11A, if the controlling signal SBSW1 is activated during T1 period of FIG. 9 and then cell data are transmitted to the main bit line MBL1 connected to the sub bit line SBL for T1 time, two cell data, that is, data "01," or data "00" are recognized.

Then, as shown in FIG. 11B, if the controlling signal SBSW2 is activated during T2 period and then cell data are transmitted to the main bit line MBL2 connected to the sub bit line SBL for T2 time, two cell data, that is, data "10" or data "01" are recognized.

Then, as shown in FIG. 11C, if the controlling signal SBSW3 is activated during T3 period and then cell data are transmitted to the main bit line MBL3 connected to the sub bit line SBL for T3 time, two cell data, that is, data "11" or data "10" are recognized.

At this time, each MBL level starts with a 0 voltage.

Figure 12:
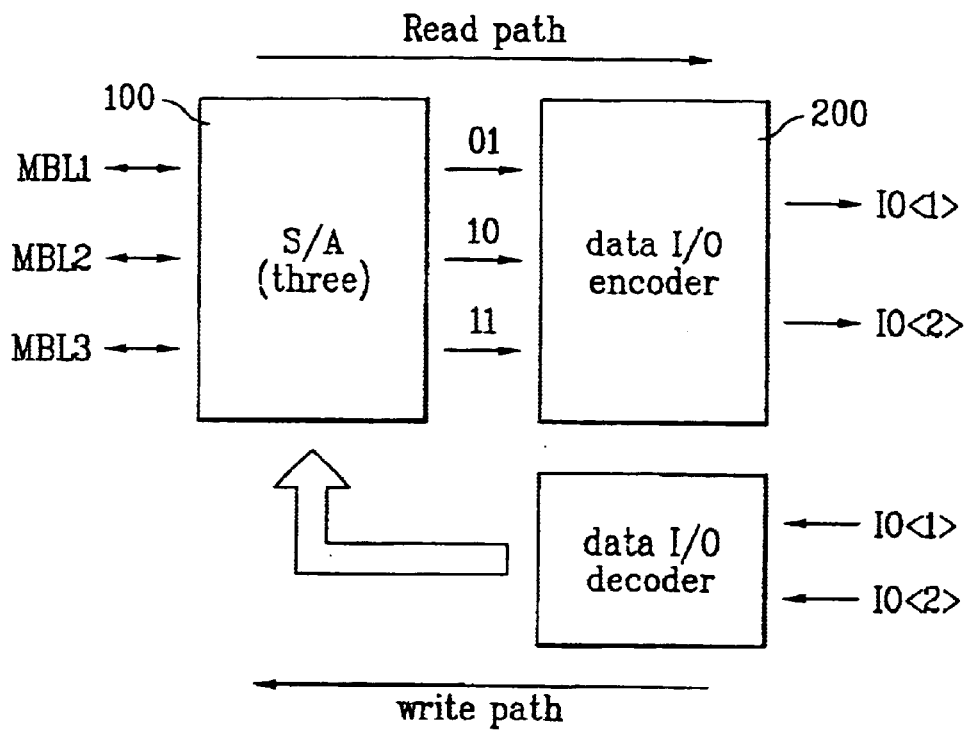
FIG. 12 illustrates a block diagram for operating read and write modes in a 2-bit cell array.

FIG. 12 illustrates a block diagram for operating read and write modes in a 2-bit cell array.

As shown in FIG. 12, in a read path, data of each of the main bit lines MBL1, MBL2, and MBL3 is input to three sensing amplifiers 100, and amplified in the three sensing amplifiers 100, thereby respectively outputting "01," "10," and "11."

Subsequently, the outputs from the three sensing amplifiers 100 are input to a data I/O encoder 200 and then encoded, thereby outputting 2-bit signals IO<1> and IO<2> through a data bus.

On the contrary, in a write path, 2-bit signals IO<1> and IO<2> in the data I/O encoder 200 are input in a data I/O decoder 300, thereby outputting three MBL signals from the data I/O decoder 300.

Figure 13:
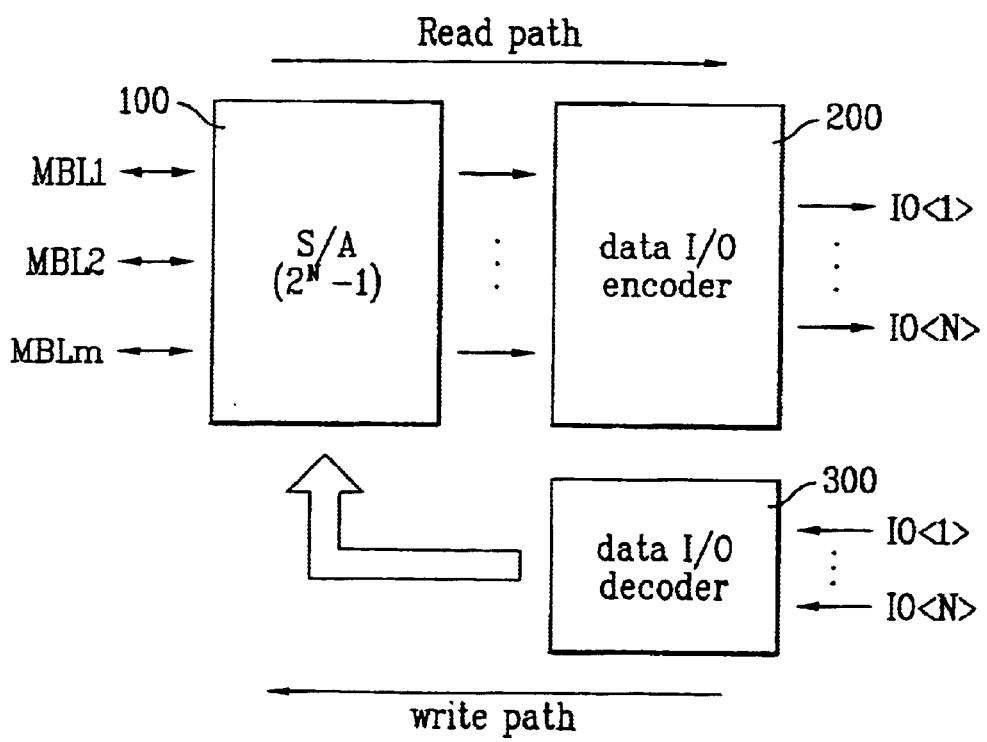
FIG. 13 illustrates a block diagram for operating read and write modes in a N-bit storage cell.

FIG. 13 illustrates a block diagram for operating read and write modes in an N-bit storage cell.

As shown in FIG. 13, in a read path, data of each of main bit lines MBL1, MBL2, ... MBLm is input in $2^N-1$ sensing amplifiers 100, and then amplified, thereby outputting.

Subsequently, the outputs from the $2^N-1$ sensing amplifiers 100 are input in the data I/O encoder 200, and then encoded, thereby outputting N-bit signals IO<1>~IO<N> through a data bus.

On the contrary, in a write path, N-bit signals IO<1>~IO<N> of the data I/O encoder 200 are input in the data I/O decoder 300, thereby outputting $2^N-1$ MBL signals from the data I/O decoder 300.

As aforementioned, the nonvolatile ferroelectric memory device and the method for driving the nonvolatile ferroelectric memory device have the following advantages.

First, an area of an entire cell layout can be reduced by replacing a plurality of cell layouts with one cell.

Second, since a cell depending on time is used in a read mode and a write voltage is used in a write mode, the operation is simplified and a core circuit is also simplified, thereby reducing a chip size and obtaining an enhanced cost competitiveness.

It will be apparent to those skilled in the art than various modifications and variations can be made in the present invention. Thus, it is intended that the present invention covers the modifications and variations of this invention provided they come within the scope of the appended claims and their equivalents.

What is claimed is:

1. A nonvolatile ferroelectric memory device comprising:
   a first cell array block and a second cell array block, each divided into an upper part and a lower part;
   sensing amplifiers arranged one by one on multiple bit lines at a middle portion between the first cell array block and the second cell array block;
   data I/O encoders connected to end portions of the multiple bit lines for outputting multi-bit signals by encoding outputs of the sensing amplifiers; and
   a first reference cell array block arranged between the first cell array block and the data I/O encoders and a second reference cell array block arranged between the second cell array block and the data I/O encoders.

2. The nonvolatile ferroelectric memory device as claimed in claim 1, wherein the multiple bit lines include first, second, and third multiple bit lines; the first cell array block and the second cell array block include a bit line consisting of one sub bit line and the first, second, and third multiple bit lines; and a switching control block for selectively connecting the sub bit line to the first, second, and third multiple bit lines, the switching control block respectively connected to the first, second, and third multiple bit lines, and activated by external controlling signals.

3. The nonvolatile ferroelectric memory device as claimed in claim 2, wherein the switching control block includes first, second, third, and fourth NMOS transistors connected to one another in series.

4. The nonvolatile ferroelectric memory device as claimed in claim 3, wherein the second, third, and fourth NMOS transistors include sources connected to the sub bit line, drains connected to the first, second, and third multiple bit lines, and gates to which independent controlling signals are respectively applied.

5. The nonvolatile ferroelectric memory device as claimed in claim 3, wherein the first NMOS transistor includes a drain connected to the sub bit line; a source to which a signal for adjusting a power to the sub bit line is applied; and a gate to which a sub bit line pull-down signal is applied.

6. The nonvolatile ferroelectric memory device as claimed in claim 3, wherein the first NMOS transistor receives a sub bit line pull-down signal and adjusts the signal into a ground level or a high level.

7. The nonvolatile ferroelectric memory device as claimed in claim 3, wherein the signal applied to the source of the first NMOS transistor for adjusting a power to the sub bit line generates a voltage higher than a voltage Vcc and supplies the voltage to the sub bit line at the time of when a high voltage is occurred in a low voltage.

8. A method for driving a nonvolatile ferroelectric memory device having a bit line including one sub bit line and first, second, and third multiple bit lines, the method comprising the steps of:

selectively connecting the sub bit line to the first, second and third multiple bit lines by respectively connecting first, second, and third switching control blocks to the first, second and third multiple bit lines;

activating the first, second and third switching control blocks by external controlling signals;

connecting the sub bit line to a drain of a pull-down switching block;

applying an external sub bit line pull-down signal to a gate of the pull-down switching block;

applying a signal for adjusting a power to the sub bit line to a source of the pull-down switching blocks; and storing cell data by applying a write voltage to the sub bit line from a low level to a high level.

9. A method for driving a nonvolatile ferroelectric memory device having a bit line including a sub bit line and first, second, and third multiple bit lines, the method comprising the steps of:

selectively connecting the sub bit line to the first, second and third multiple bit lines by respectively connecting first, second, and third switching control blocks to the first, second and third multiple bit lines;

activating the first, second, and third switching control blocks by external controlling signals;

connecting the sub bit line to a drain of a pull-down switching block;

applying an external sub bit line pull-down signal to a gate of the pull-down switching block;

applying a signal for adjusting a power to the sub bit line to a source of the pull-down switching block; and dividing a plurality of time periods by using external signals which control the switching control blocks, so that charges generated in the corresponding periods are respectively distributed to the first, second and third multiple bit lines, thereby detecting each level.

10. The method as claimed in claim 9, wherein 2-bit data output 11 in a case where the first, second and third multiple bit lines are all activated.

11. The method as claimed in claim 9, wherein 2-bit data output 10 in a case where only two multiple bit lines are activated among the first, second and third multiple bit lines.

12. The method as claimed in claim 9, wherein 2-bit data output 01 in a case where only one multiple bit line is activated among the first, second and third multiple bit lines.

13. The method as claimed in claim 9, wherein 2-bit data output 00 in a case where all the first, second and third multiple bit lines are inactivated.

* * * * *